(12) United States Patent
Esquivel

(10) Patent No.: US 7,649,400 B2
(45) Date of Patent: Jan. 19, 2010

(54) BACK GATE BIASING OVERSHOOT AND UNDERSHOOT PROTECTION CIRCUITRY

(75) Inventor: John E. Esquivel, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 247 days.

(21) Appl. No.: 11/237,499

(22) Filed: Sep. 28, 2005

(65) Prior Publication Data

US 2007/0069797 A1    Mar. 29, 2007

(51) Int. Cl.
*H03K 17/16* (2006.01)
(52) U.S. Cl. .................. 327/379; 327/388; 327/534
(58) Field of Classification Search .......... 327/309, 327/379, 387, 388, 404, 534, 535
See application file for complete search history.

(56) References Cited

U.S. PATENT DOCUMENTS

| | | | | |
|---|---|---|---|---|
| 5,963,080 A | | 10/1999 | Miske et al. | 361/91.1 |
| 6,060,921 A | * | 5/2000 | Daniell | 327/170 |
| 6,163,199 A | * | 12/2000 | Miske et al. | 327/434 |
| 6,236,259 B1 | * | 5/2001 | Goodell et al. | 327/534 |
| 6,320,408 B1 | * | 11/2001 | Kwong | 326/31 |
| 6,400,546 B1 | * | 6/2002 | Drapkin et al. | 361/111 |
| 6,538,867 B1 | | 3/2003 | Goodell et al. | 327/534 |
| 6,628,159 B2 | * | 9/2003 | Voldman | 327/534 |

\* cited by examiner

*Primary Examiner*—Hai L Nguyen
(74) *Attorney, Agent, or Firm*—John J. Patti; Wade J. Brady, III; Frederick J. Telecky, Jr.

(57) ABSTRACT

The signal switch has flat resistance across the input/output voltage range when in the ON state while still isolating input/output nodes from overshoots and undershoots when in the off state. The signal switch includes: a p channel switch coupled between a first input/output node and a second input/output node; an n channel switch coupled in parallel with the p channel switch; an overshoot protection block having a first output coupled to a backgate of the p channel switch, a first input coupled to the first input/output node, a second input coupled to the second input/output node, a third input coupled to a gate of the p channel switch, and a second output coupled to a p-rail voltage node; and an undershoot protection block having a first output coupled to a backgate of the n channel switch, a first input coupled to the first input/output node, a second input coupled to the second input/output node, a third input coupled to a gate of the n channel switch, and a second output coupled to an n-rail voltage node.

7 Claims, 5 Drawing Sheets

BACK GATE BIASING OVERSHOOT AND UNDERSHOOT PROTECTION CIRCUITRY

FIELD OF THE INVENTION

The present invention relates to electronic circuitry and, in particular, to back gate biasing overshoot and undershoot protection circuitry.

BACKGROUND OF THE INVENTION

Signal switches are often used to isolate one block of circuitry from another or from the outside world. In this situation, a signal switch can be placed at the end of a transmission line or connected to an external input/output (IO) port. Symptoms of this placement are undershoot and overshoot voltages. Typical signal switches will turn on during undershoot and overshoot events, even when the switch is explicitly turned off, causing errors to data channels connected to the switch's IO ports. Another requirement of signal switches, is when the switch is on, the blocks of circuitry connected to the IO ports need to be connected to each other through low impedance paths. The lower the IO impedance (Ron) the less likely a data error will occur. In addition, Ron variations across the IO voltage range cause distortion to analog signals.

A typical prior art circuit is shown in FIG. 1. The circuit includes inverters INV1, INV2, INV3, and INV4; transistors P0 and N0; input/output nodes A and B; control signal OE; and gate nodes pgate and ngate. Diode connected transistors, parasitic diodes, or explicit diodes Da, Db, and Dc are used to take the voltage on node prail from a diode drop below voltage Vcc to a voltage higher than voltage Vcc if there is an overshoot. Similarly, diodes Dd, De, and Df are used to take the voltage on node nrail from a diode drop above ground Gnd to a voltage lower than ground Gnd if there is an undershoot. While previous solutions protect from overshoot and undershoot, they lack backgate biasing to reduce Ron. A prior art method to reduce the Ron across the IO voltage range is to increase the transmission gate size. However, the increase in capacitance is much greater than the addition of the backgate biasing overshoot undershoot protection circuitry. In addition increasing the transmission gate size does not flatten the Ron versus IO voltage curve, which is important to decreasing signal distortion.

SUMMARY OF THE INVENTION

A signal switch circuit with backgate bias protection circuitry includes: a p channel switch coupled between a first input/output node and a second input/output node; an n channel switch coupled in parallel with the p channel switch; an overshoot protection block having a first output coupled to a backgate of the p channel switch, a first input coupled to the first input/output node, a second input coupled to the second input/output node, a third input coupled to a gate of the p channel switch, and a second output coupled to a p-rail voltage node; and an undershoot protection block having a first output coupled to a backgate of the n channel switch, a first input coupled to the first input/output node, a second input coupled to the second input/output node, a third input coupled to a gate of the n channel switch, and a second output coupled to an n-rail voltage node.

DETAILED DESCRIPTION OF PREFERRED EMBODIMENTS

The back gate bias protection circuitry, according to the present invention, reduces the Ron (IO impedance) across the IO voltage range when the signal switch is on while isolating the IO ports from each other when the switch is off and an overshoot or undershoot events occurs.

Figure 1:
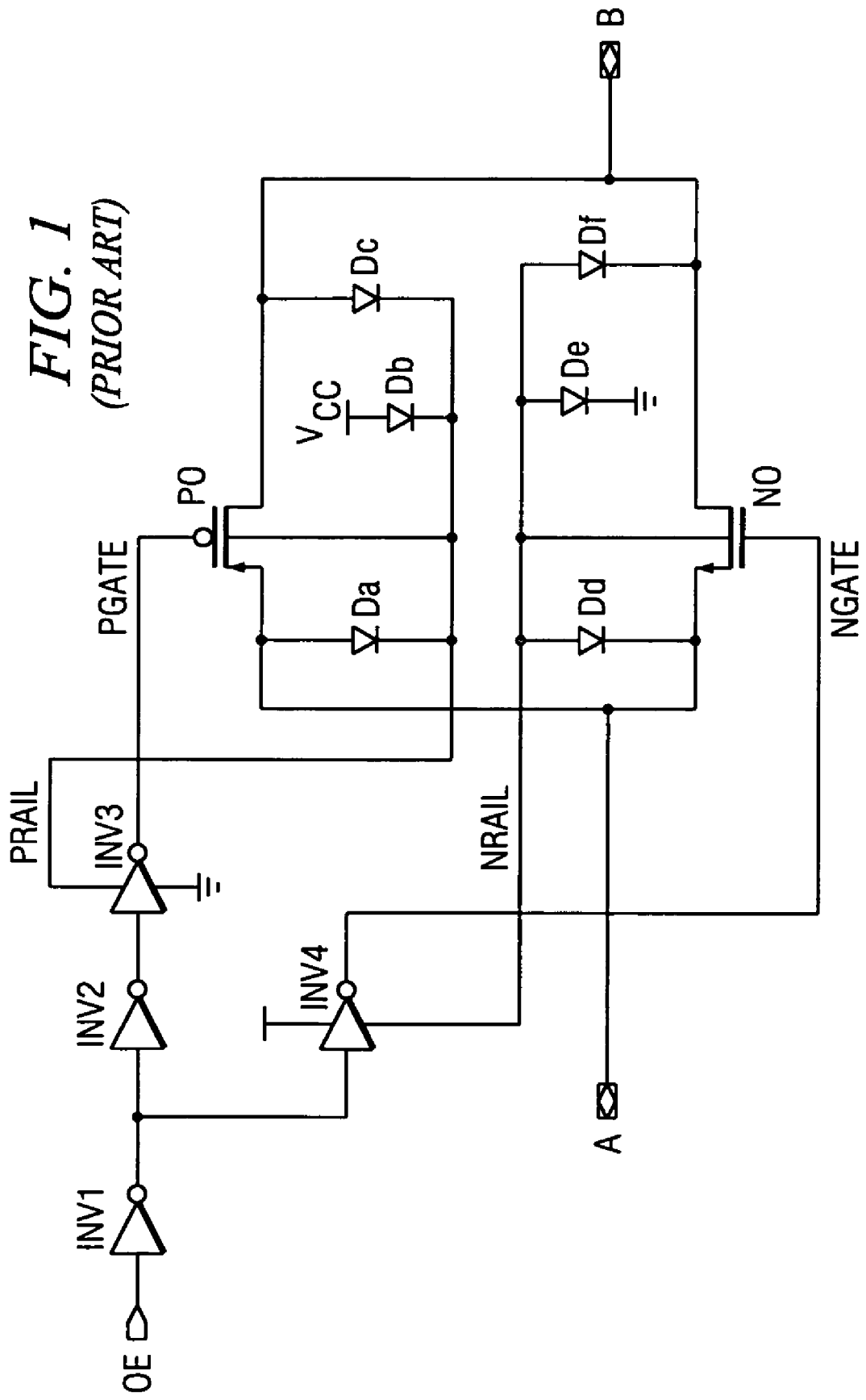
FIG. 1 is a circuit diagram of a prior art signal switch with back gate bias and overshoot/undershoot protection.
Figure 2:
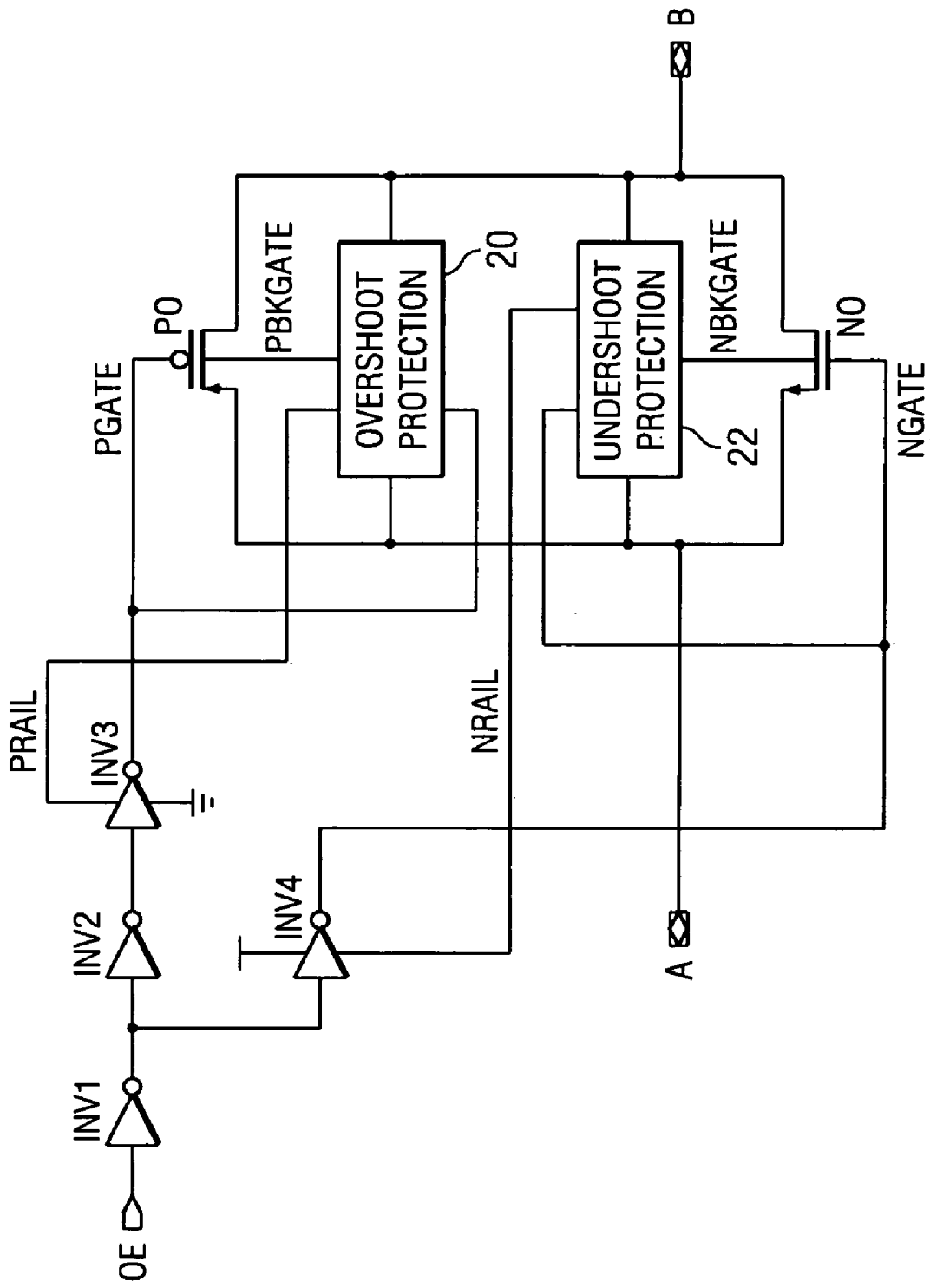
FIG. 2 is a circuit diagram of a signal switch with a preferred embodiment back gate bias and overshoot/undershoot protection.

A signal switch, shown in FIG. 2, includes overshoot protection block 20; undershoot protection block 22; transistors P1 and N1; inverters INV1, INV2, INV3, and INV4; switch control signal node OE; input/output nodes A and B; voltage rails prail and nrail; transistor gate nodes pgate and ngate; transistor backgate nodes pbkgate and nbkgate. The signal switch is a transmission gate composed of Pchannel device P0 and Nchannel device N0. The signal switch is turned off by taking node OE low.

Figure 3:
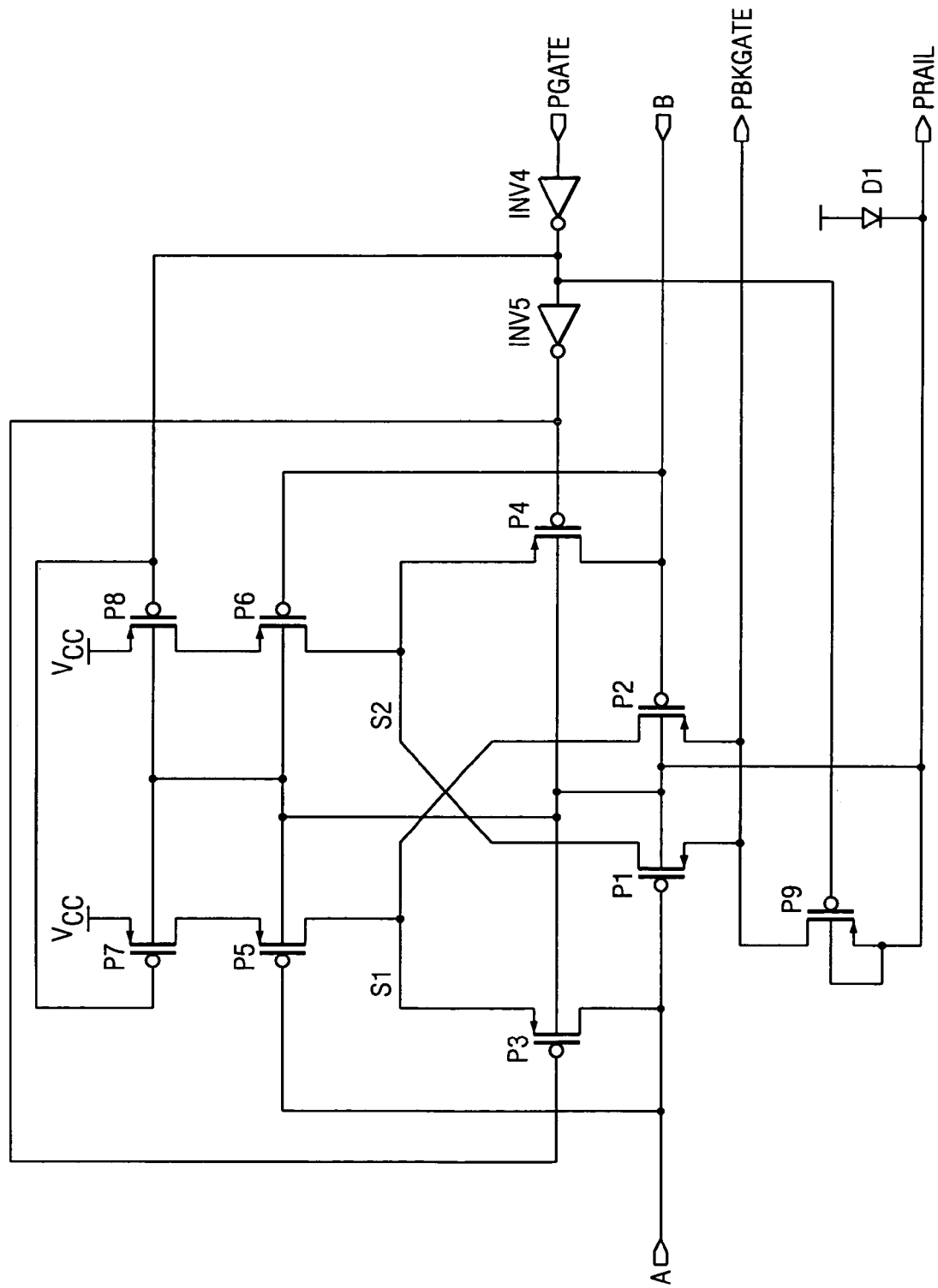
FIG. 3 is a circuit diagram of a preferred embodiment overshoot protection device.

The preferred embodiment overshoot protection block, shown in FIG. 3, includes transistors P1-P9; inverters INV4 and INV5; and diode D1. The overshoot protection block operates as follows. The node pgate goes high which turns on transistors P7, P8 and P9. Transistor P9 ties nodes prail and pbkgate together. When either node A or node B voltages are a threshold voltage (Vtp) below source voltage Vcc, the nodes prail and pbkgate are pulled up to voltage Vcc through the path of Pchannels P8, P6, P1 or P7, P5, P2 respectively. If the voltages on both nodes A and B are equal to voltage Vcc, then nodes prail and pbkgate are pulled to within a diode drop of source voltage Vcc. Therefore the voltage of the gate and backgate of transistor P0 from FIG. 2 are equal to the voltage at node prail. Transistor P0 is off and does not allow any voltage equal to or lower than voltage Vcc, even below ground voltage Gnd, to pass through the Pchannel portion of the switch. If the voltage at node A rises above voltage Vcc, in FIG. 3, transistor P3 turns on and transistor P5 turns off. The voltage on Node s1 rises above voltage Vcc and passes through transistor P2, assuming the voltage on node B is lower than the voltage on node A. Now nodes pbkgate and prail are equal to the voltage on node A that is above voltage Vcc. Therefore the gate and backgate of transistor P0 from FIG. 2 are equal to the voltage on node A. The switch's Pchannel P0 is off and does not allow any voltage equal to or lower than the voltage on node A to pass through the Pchannel portion of the switch. Similarly if the voltage on node B goes higher than voltage Vcc and the voltage on node A, the gate and backgate of Pchannel P0 from FIG. 2 are equal to the voltage on node B. The switch's Pchannel P0 is now off and will not allow any voltage equal to or lower than the voltage on node B to pass through the Pchannel portions of the switch. The signal switch is turned on by taking node QE of FIG. 2 high. Looking at FIG. 3, now node pgate is low, turning transistors P7, P8, and P9 off. Node prail is separated from node pbkgate and is taken to a diode drop below voltage Vcc by diode D1, and transistors P3 and P4 are turned on and tie node A to node s1 and node B to node s2. Pchannels P1 and P2 cause node pbkgate to be equal to the highest voltage of nodes A or B. Now the voltage of the gate of Pchannel P0 from FIG. 2 is equal to ground Gnd and the Pchannel portion of the signal switch is on. The backgate of Pchannel P0 is biased to the highest voltage of nodes A or B instead of voltage Vcc, which lowers the bulk-source voltage (Vbs) of Pchannel P0 when the voltages on nodes A and B are below voltage Vcc. Decreasing the Vbs of Pchannel P0, increases the drive strength of the Pchannel, and therefore lowers Ron.

Figure 4:
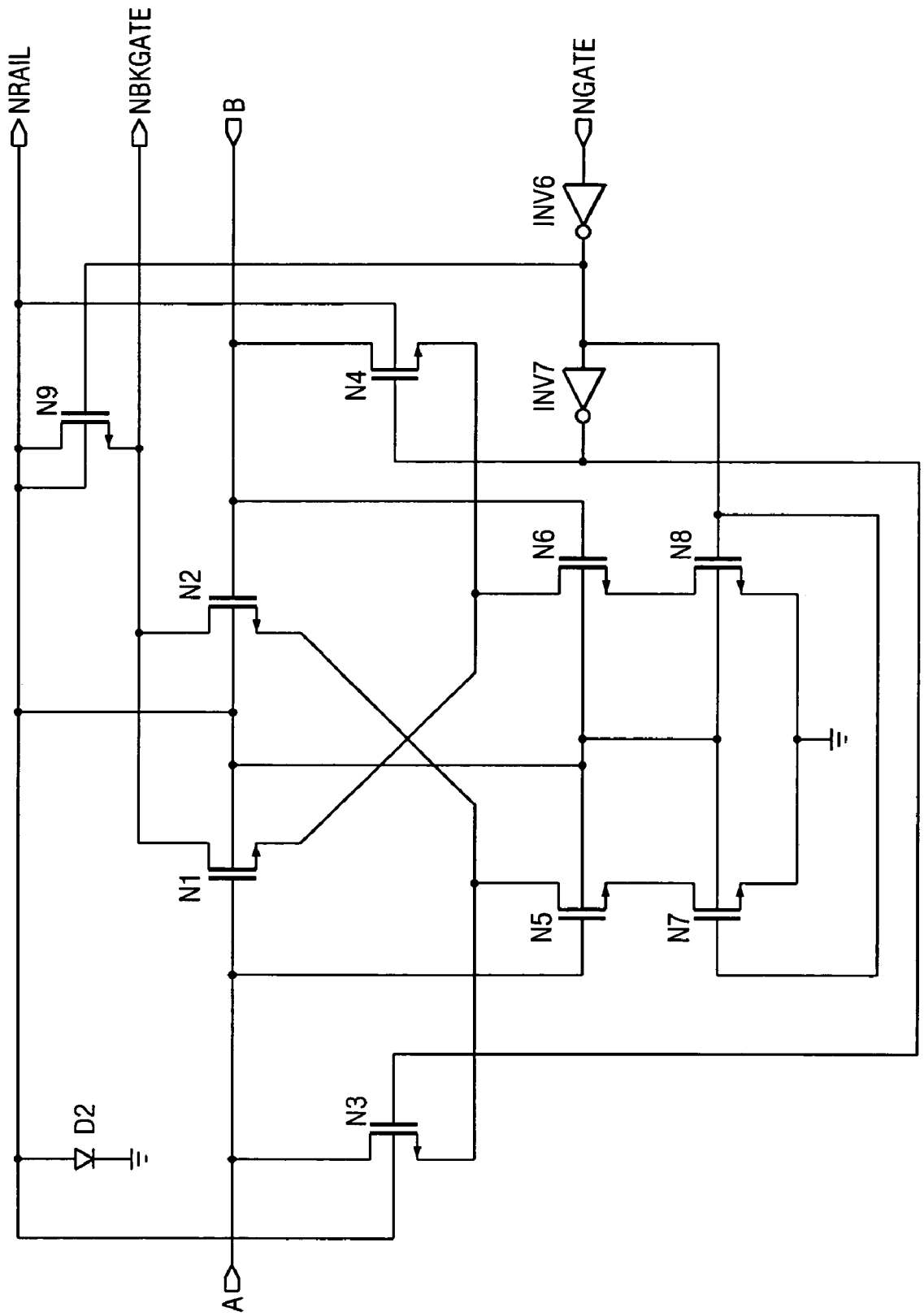
FIG. 4 is a circuit diagram of a preferred embodiment undershoot protection device.

The preferred embodiment undershoot protection block is shown in FIG. 4. The undershoot protection block includes transistors N1-N9; inverters INV6 and INV7; and diode D2. The undershoot protection block serves a complementary function to the overshoot protection block. When the switch is turned off and the voltages on nodes A and B are above ground Gnd, the undershoot protection circuitry pulls the gate and backgate of Nchannel N1, shown in FIG. 2, within a diode drop of ground Gnd. When the switch is off and either node A or B is below ground Gnd the undershoot circuitry sets the gate and backgate of Nchannel N1 to the lowest voltage of nodes A or B. Therefore when the switch is off no signal above the lowest voltage of nodes A or B, including above voltage Vcc, will pass through the Nchannel portion of the switch. When the switch is on, the gate of Nchannel N1 will be set to voltage Vcc and the backgate of Nchannel N1 will be biased to the lower of the voltage on node A or B, instead of ground Gnd, which makes the Vbs of Nchannel N1 less negative when the voltages on nodes A and B are above ground Gnd. Biasing the Vbs of Nchannel N1 less negative, increases the drive strength of the Nchannel, and therefore lowers Ron across the IO voltage range.

Figure 5:
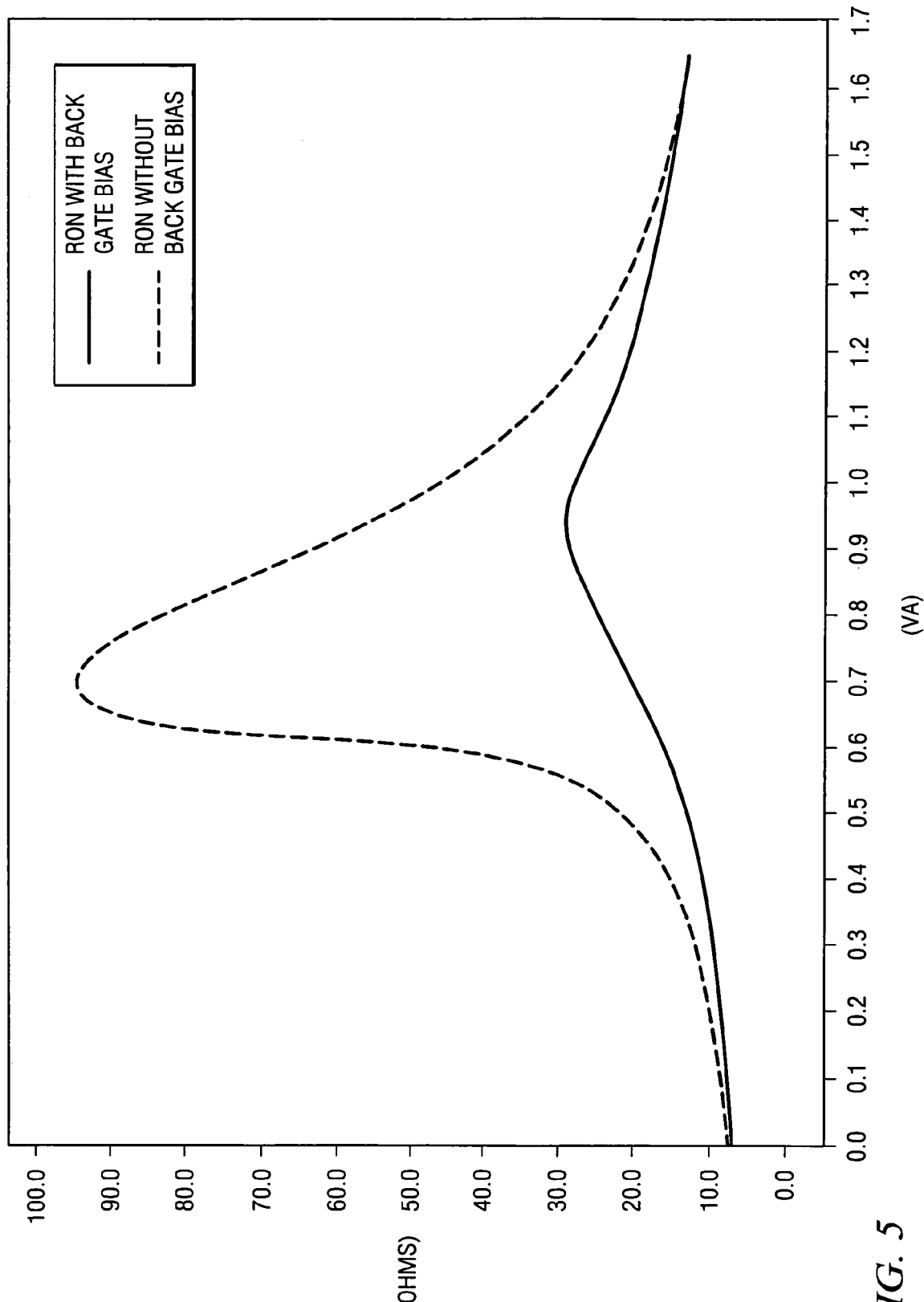
FIG. 5 is a plot comparing a signal switch with the backgate bias circuit of the preferred embodiment to a signal switch without the preferred embodiment circuit.

The advantage of this invention is lower Ron across the IO voltage range while still isolating from overshoot and undershoot events when the switch is off. The effect of backgate biasing to reduce Ron as the IO voltage moves away from voltage Vcc and ground Gnd, especially at lower Vcc voltages, is shown in the plot in FIG. 5. FIG. 5 shows a plot of a transmission gate signal switch with the Pchannel backgate tied to node Vcc and Nchannel backgate tied to node Gnd when the switch is on and voltage Vcc is equal to 1.65 volts, labeled "RON w/o bg bias". Also in FIG. 5 is a plot of the preferred embodiment solution with the same size Nchannel and Pchannel transmission gate, turned on and voltage Vcc set to 1.65 volts, labeled "RON w bg bias".

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A signal switch circuit comprising:
   a first p-channel transistor coupled to a first input/output node at its drain and a second input/output node at its source;
   an n-channel transistor coupled in parallel with the first p-channel transistor;
   an overshoot protection block having:
      a first inverter that is coupled to the gate of the first p-channel transistor;
      a second inverter that is coupled to the first inverter;
      a second p-channel transistor that is coupled to the first input/output node at its gate and a backgate of the p-channel transistor at its source;
      a third p-channel transistor that is coupled to the second input/output node at its gate and the backgate of the p-channel transistor at its source;
      a fourth p-channel transistor that is coupled to the second inverter at its gate, the first input/output node at its drain, and the drain of the third p-channel transistor at its source;
      a fifth p-channel transistor that is coupled to the second inverter at its gate, the second input/output node at its drain, and the drain of the second p-channel transistor at its source; and
      a sixth p-channel transistor that is coupled to the sources of the second and third p-channel transistors at its drain, the first inverter at its gate, and a p-rail voltage node at its source; and
   an undershoot protection block having a first output coupled to a backgate of the n-channel transistor, a first input coupled to the first input/output node, a second input coupled to the second input/output node, a third input coupled to a gate of the n-channel transistor, and a second output coupled to an n-rail voltage node.

2. The apparatus of claim 1, wherein the overshoot protection block further comprises:
   a seventh p-channel transistor that is coupled to the first input/output node at its gate and the source of the fourth p-channel transistor at its drain; and
   an eighth p-channel transistor that is coupled to the second input/output node at its gate and the source of the fifth p-channel transistor at its drain.

3. A signal switch circuit comprising:
   a p-channel transistor coupled to a first input/output node at its drain and a second input/output node at its source;
   a first n-channel transistor coupled in parallel with the p-channel transistor;
   an overshoot protection block having:
   a first output coupled to a backgate of the p-channel transistor, a first input coupled to the first input/output node, a second input coupled to the second input/output node, a third input coupled to a gate of the p-channel transistor, and a second output coupled to a p-rail voltage node; and
   an undershoot protection block having:
      a first inverter that is coupled to the gate of the first n-channel transistor;
      a second inverter that is coupled to the first inverter;
      a second n-channel transistor that is coupled to the first input/output node at its gate and a backgate of the p-channel transistor at its drain;
      a third n-channel transistor that is coupled to the second input/output node at its gate and the backgate of the p-channel transistor at its drain;
      a fourth n-channel transistor that is coupled to the second inverter at its gate, the first input/output node at its drain, and the source of the third n-channel transistor at its source;
      a fifth n-channel transistor that is coupled to the second inverter at its gate, the second input/output node at its drain, and the source of the second n-channel transistor at its source; and
      a sixth n-channel transistor that is coupled to the drains of the second and third n-channel transistors at its source, the first inverter at its gate, and an n-rail voltage node at its drain.

4. The apparatus of claim 3, wherein the undershoot protection block further comprises:
   a seventh n-channel transistor that is coupled to the first input/output node at its gate and the source of the fourth n-channel transistor at its drain; and an eighth n-channel transistor that is coupled to the second input/output node at its gate and the source of the fifth n-channel transistor at its drain.

5. A signal switch circuit comprising:
a first p-channel transistor coupled to a first input/output node at its drain and a second input/output node at its source;
a first n-channel transistor coupled in parallel with the p-channel transistor;
an overshoot protection block having:
  a first inverter that is coupled to the gate of the first p-channel transistor;
  a second inverter that is coupled to the first inverter;
  a second p-channel transistor that is coupled to the first input/output node at its gate and a backgate of the p-channel transistor at its source;
  a third p-channel transistor that is coupled to the second input/output node at its gate and the backgate of the p-channel transistor at its source;
  a fourth p-channel transistor that is coupled to the second inverter at its gate, the first input/output node at its drain, and the drain of the third p-channel transistor at its source;
  a fifth p-channel transistor that is coupled to the second inverter at its gate, the second input/output node at its drain, and the drain of the second p-channel transistor at its source; and
  a sixth p-channel transistor that is coupled to the sources of the second and third p-channel transistors at its drain, the first inverter at its gate, and a p-rail voltage node at its source; and
an undershoot protection block having:
  a third inverter that is coupled to the gate of the first n-channel transistor;
  a fourth inverter that is coupled to the third inverter;
  a second n-channel transistor that is coupled to the first input/output node at its gate and a backgate of the p-channel transistor at its drain;
  a third n-channel transistor that is coupled to the second input/output node at its gate and backgate of the p-channel transistor at its drain;
  a fourth n-channel transistor that is coupled to the fourth inverter at its gate, the first input/output node at its drain, and the source of the third n-channel transistor at its source;
  a fifth n-channel transistor that is coupled to the fourth inverter at its gate, the second input/output node at its drain, and the source of the second n-channel transistor at its source; and
  a sixth n-channel transistor that is coupled to the drains of the second and third n-channel transistors at its source, the third inverter at its gate, and an n-rail voltage node at its drain.

6. The apparatus of claim 5, wherein the overshoot protection block further comprises:
a seventh p-channel transistor that is coupled to the first input/output node at its gate and the source of the fourth p-channel transistor at its drain; and
an eighth p-channel transistor that is coupled to the second input/output node at its gate and the source of the fifth p-channel transistor at its drain.

7. The apparatus of claim 5, wherein the undershoot protection block further comprises:
a seventh n-channel transistor that is coupled to the first input/output node at its gate and the source of the fourth n-channel transistor at its drain; and
an eighth n-channel transistor that is coupled to the second input/output node at its gate and the source of the fifth n-channel transistor at its drain.

* * * * *

UNITED STATES PATENT AND TRADEMARK OFFICE
CERTIFICATE OF CORRECTION

| | | |
|---|---|---|
| PATENT NO. | : 7,649,400 B2 | Page 1 of 1 |
| APPLICATION NO. | : 11/237499 | |
| DATED | : January 19, 2010 | |
| INVENTOR(S) | : John E. Esquivel | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 31 days.

Signed and Sealed this

Twenty-eighth Day of December, 2010

David J. Kappos
*Director of the United States Patent and Trademark Office*